(12) United States Patent
Nishiyama

(10) Patent No.: US 10,104,819 B2
(45) Date of Patent: Oct. 16, 2018

(54) COMPONENT MOUNTING MACHINE

(71) Applicant: FUJI CORPORATION, Chiryu (JP)

(72) Inventor: Satoru Nishiyama, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 241 days.

(21) Appl. No.: 14/900,503

(22) PCT Filed: Jul. 12, 2013

(86) PCT No.: PCT/JP2013/069215
§ 371 (c)(1),
(2) Date: Dec. 21, 2015

(87) PCT Pub. No.: WO2015/004814
PCT Pub. Date: Jan. 15, 2015

(65) Prior Publication Data
US 2016/0219761 A1    Jul. 28, 2016

(51) Int. Cl.
*H05K 13/04* (2006.01)
*H05K 13/08* (2006.01)

(52) U.S. Cl.
CPC ......... *H05K 13/0404* (2013.01); *H05K 13/08* (2013.01)

(58) Field of Classification Search
CPC .......... G86F 19/00; H05K 3/30; H05K 13/00; H05K 13/04; H05K 13/0404; H05K 13/08
See application file for complete search history.

(56) References Cited

U.S. PATENT DOCUMENTS 4,875,285 A * 10/1989 Haan ............... H05K 13/04
29/740
4,979,286 A * 12/1990 Nakayama ......... H05K 13/0413
29/740
(Continued)

FOREIGN PATENT DOCUMENTS

CN    102573439 A    7/2012
JP    8-10798    *    1/1996
(Continued)

OTHER PUBLICATIONS

Office Action dated Feb. 21, 2017 in European Patent Application No. 13 889 299.7.
(Continued)

*Primary Examiner* — Carl Arbes
(74) *Attorney, Agent, or Firm* — Oblon, McClelland, Maier & Neustadt, L.L.P.

(57) ABSTRACT

A rotary head is configured of at least two types of rotary heads, such as a first rotary head in which four suction nozzles are respectively held to be rotatable on the circumference, and a second rotary head in which the suction nozzles of which the number is more than four are respectively held to be rotatable on a pitch circle diameter which is the same as that of the suction nozzle of the first rotary head, the first rotary head is attached to the drive unit, and a control device which controls an angular position of the first rotary head and an angular position of the components suctioned to the suction nozzles, to be respectively controlled to be changed by 45 degrees when the components held by the suction nozzles are imaged by a component camera is provided.

5 Claims, 8 Drawing Sheets

(56) References Cited

U.S. PATENT DOCUMENTS

| | | | | |
|---|---|---|---|---|
| 5,155,903 A * | 10/1992 | Nakashima | ........ | H05K 13/0413 29/740 |
| 5,208,975 A * | 5/1993 | Hidese | ............... | H05K 13/0069 29/714 |
| 5,410,801 A * | 5/1995 | Shiloh | ................ | H05K 13/0408 29/740 |
| 5,862,586 A * | 1/1999 | Kimura | ............. | H05K 13/0452 29/832 |
| 7,330,773 B2 * | 2/2008 | Jonke | ................ | H05K 13/0408 29/832 |

FOREIGN PATENT DOCUMENTS

| | | |
|---|---|---|
| JP | 2009 177213 | 8/2009 |
| WO | WO 2004/066701 A1 | 8/2004 |
| WO | WO 2012/140975 A1 | 10/2012 |

OTHER PUBLICATIONS

International Search Report dated Sep. 17, 2013 in PCT/JP2013/069215 filed Jul. 12, 2013.

Combined Office Action and Search Report dated Dec. 1, 2017 in Chinese Patent Application No. 201380078083.X (with partial English language translation and English translation of categories of cited documents), 13 pages.

* cited by examiner

COMPONENT MOUNTING MACHINE

TECHNICAL FIELD

The present disclosure relates to a component mounting machine provided with a rotary head which holds a plurality of suction nozzles on a circumference.

BACKGROUND ART

As a suction nozzle which is held by a mounting head of a component mounting machine, a suction nozzle which appropriately corresponds to the type (size or shape) of the suctioned component is used. For this reason, an example in which the mounting head can be replaced corresponding to the type of the suctioned component is described in PTL1. However, in such a type of component mounting machine in the related art, since the entire mounting head including an R-axis drive device which rotates a rotary head or a θ-axis drive device which rotates the suction nozzle is configured to be replaced, the size and the weight of the head part to be replaced increase, and costs of the component mounting machine increase.

CITATION LIST

Patent Literature

PTL 1: JP-A-2009-177213

SUMMARY

Technical Problem

In order to solve such a problem, in recent years, the mounting head which is configured of a drive unit and a rotary head that is attachable to and detachable from the drive unit, and which can commonly use the drive unit with respect to plural types of rotary heads to be replaced, has been studied. According to this, since the R-axis drive device or the θ-axis drive device may be provided on the common drive unit side, it is possible to reduce the weight and the size of the rotary head to be replaced, and it becomes easy to replace the rotary head.

However, when the common drive unit is used with respect to the plural types of rotary heads, in both cases of the rotary head which holds twelve suction nozzles on a circumference in order to suction a component which is smaller than a predetermined size, and the rotary head which holds four suction nozzles on the circumference in order to suction a component which is larger than a predetermined size, the structures are the same except for the number of nozzles, and pitch circle diameters (P.C.D) of the suction nozzles are also the same dimension (refer to FIG. 10A and FIG. 10B.

For this reason, as illustrated in FIG. 10B, when imaging components PB which are suctioned by suction nozzles 1 and are smaller than the predetermined size by a component camera by using a rotary head 2B which holds twelve suction nozzles 1, it is possible to image all of the suctioned components PB at once on the inside of a viewing field IA by the component camera, but as illustrated in FIG. 10A, when imaging components PA which are suctioned by the suction nozzles 1 and are larger than the predetermined size by a component camera by using a rotary head 2A which holds four suction nozzles 1, there is a problem that the components PA protrude from the inside of the viewing field IA (parts with diagonal lines in FIG. 10A), and it is necessary to use a component camera having a wider viewing field.

In consideration of the problem in the above-described related art, an object of the present disclosure is to provide a component mounting machine in which it is possible to image large components by changing the position of the component to be image-processed, without increasing a viewing field of the camera even in a case where the component is suctioned by four suction nozzles on a circumference.

Solution to Problem

In order to achieve the above-described task, the disclosure according to an aspect provides a component mounting machine, including: a movable base which is movable within an XY plane with respect to a base; a rotary head which is attached to be attachable to and detachable from a drive unit supported by the movable base, which holds a plurality of suction nozzles on a circumference, and which is rotatable around an axial line; a component camera which can image all of the components suctioned to the plurality of suction nozzles of the rotary head at once within one viewing field; and a control device in which an angular position of the first rotary head and an angular position of the component suctioned to the suction nozzle are respectively controlled to be changed by 45 degrees when the first rotary head is attached to the drive unit, and the component held by the suction nozzle is imaged by the component camera, in which the rotary head is configured of at least two types of rotary heads, such as a first rotary head in which four suction nozzles are respectively held to be rotatable on the circumference, and a second rotary head in which the suction nozzles of which the number is more than four are respectively held to be rotatable on a pitch circle diameter which is the same as that of the suction nozzle of the first rotary head.

In the disclosure of an aspect, even when the size of the components suctioned to the four suction nozzles held by the first rotary head is large, it is possible to image all of the components suctioned to the four suction nozzles without increasing the viewing field of the component camera.

The disclosure according to an aspect provides the component mounting machine, in which, when components which are larger than a predetermined size are suctioned to the suction nozzle, the first rotary head is attached to the drive unit, and when components which are smaller than the predetermined size are suctioned to the suction nozzle, the second rotary head is attached to the drive unit, and the component camera has a viewing field having a size necessary for imaging all of the components suctioned to the suction nozzles of the second rotary head.

In the disclosure of an aspect, by using the component camera which images the components suctioned to the suction nozzles of the second rotary head as it is, it is possible to image the large components suctioned to the suction nozzles of the first rotary head.

The disclosure according to an aspect provides the component mounting machine, in which, in the control device, at least two types of mounting programs which control a rotation angle of the rotary head and a rotation angle of the component suctioned to the suction nozzle, corresponding to the type of the rotary head, are stored, and a switching control section, which switches the mounting program when a different type of the rotary head is attached to the drive unit, is provided.

In the disclosure of an aspect, by switching the mounting program by the switching control section, it is possible to reliably perform a sequence operation which corresponds to the type of the rotary head.

The disclosure according to an aspect provides the component mounting machine, in which, in the drive unit, an R-axis drive device which rotates the rotary head around the axial line, a θ-axis drive device which rotates the suction nozzle around a θ-axis, and a Z-axis drive device which raises and lowers the suction nozzle in a Z-axis direction, are provided.

In the disclosure of an aspect, since the R-axis drive device or the θ-axis drive device may be provided in the common drive unit to which the first and second rotary heads are attached to be attachable and detachable, it is possible to reduce the size and the weight of the rotary head.

The disclosure according to an aspect provides the component mounting machine, in which a cylindrical gear rotated by the θ-axis drive device is supported to be rotatable around the axial line of the rotary head, and as the cylindrical gear rotates around the axial line, each suction nozzle rotates around the θ-axis.

In the disclosure of an aspect, it is possible to commonly use the drive device which rotates each suction nozzle around the θ-axis by each suction nozzle.

DESCRIPTION OF EMBODIMENTS

Figure 1:
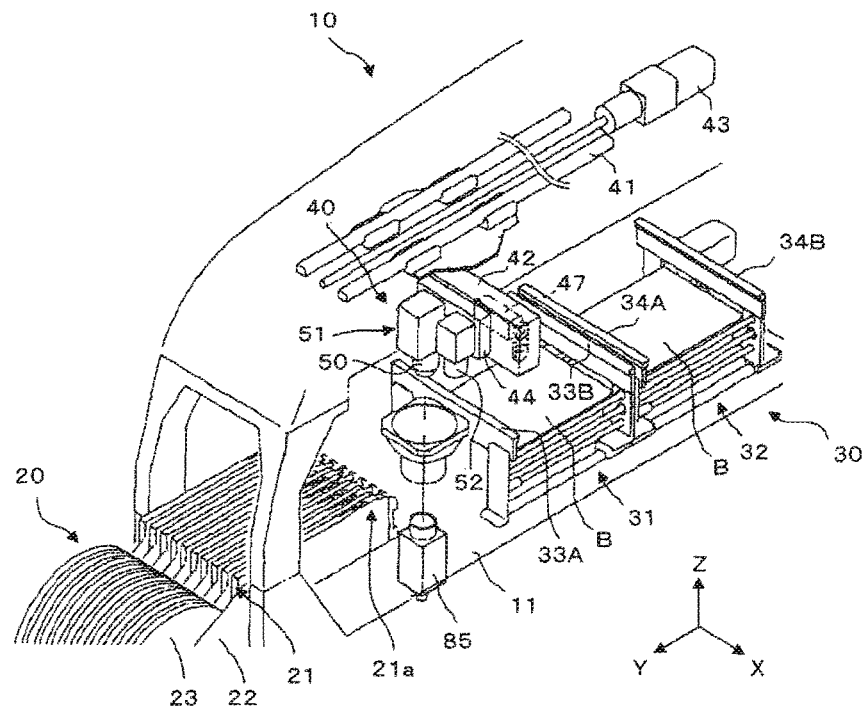
FIG. 1 is a perspective view illustrating the entire component mounting machine according to an embodiment of the present disclosure.

Hereinafter, the embodiment of the present disclosure will be described based on the drawings. As illustrated in FIG. 1, a component mounting machine 10 includes a component supply device 20, a board conveyance device 30, and a component transfer device 40.

As an example, the component supply device 20 is configured to align a plurality of tape feeders 21 in parallel to each other on a base 11 in an X-axis direction. The tape feeders 21 are detachably mounted to a main body frame 22 which is attached to be separable from the base 11, and include a supply reel 23 which winds tapes that accommodate multiple electronic components (hereinafter, referred to as components) in one row at an interval. Although not illustrated, inside the tape feeder 21, a motor which is driving source that pitch-feeds the tapes is embedded, the tape is sent out by one pitch by the motor, and the components accommodated in the tape are sequentially supplied to a component supply position 21a provided in the distal end portions of each tape feeder 21.

The board conveyance device 30 conveys a circuit board B in the X-axis direction, and positions and holds the circuit board B at a predetermined mounting position, and as an example, is configured of a dual-lane type in which conveyance lanes 31 and 32 are aligned in parallel in two rows in a Y direction which is perpendicular to the X-axis direction. Each of the conveyance lanes 31 and 32 is horizontally aligned and parallel by making guide rails 33A, 333, 34A, and 343 oppose each other as pairs on the base 11. On the conveyance lanes 31 and one pair of conveyor belts (not illustrated) which supports and conveys a circuit board B guided by the guide rails 33A, 33B, 34A, and 34B are aligned in parallel.

The component transfer device 40 is configured of an XY robot, and the XY robot is constructed on the base is installed above the component supply device 20 and the board conveyance device 30, and is provided with a Y-axis slide 42 which is movable in the Y-axis direction along a guide rail 41. The movement of the Y-axis slide 42 in the Y-axis direction is controlled by a servo motor 43 via a ball screw which is not illustrated. In the Y-axis slide 42, an X-axis slide 44 is guided and supported to be movable in the X-axis direction along a guide rail which is not illustrated, and the movement of the X-axis slide 44 in the X-axis direction is controlled by a servo motor 47 via a ball screw which is not illustrated. The X-axis slide 44 configures a movable base which can be moved in the X-axis direction and in the Y-axis direction.

On the movable base (X-axis slide) 44, a drive unit 51 to which a rotary head 50 that is rotatable around an axial line is attached to be attachable and detachable is supported to be movable in a vertical direction. In addition, a board camera 52 which is configured of a CCD camera that images a board mark which is not illustrated and formed on the circuit board B from above is attached to the movable base 44.

Figure 2:
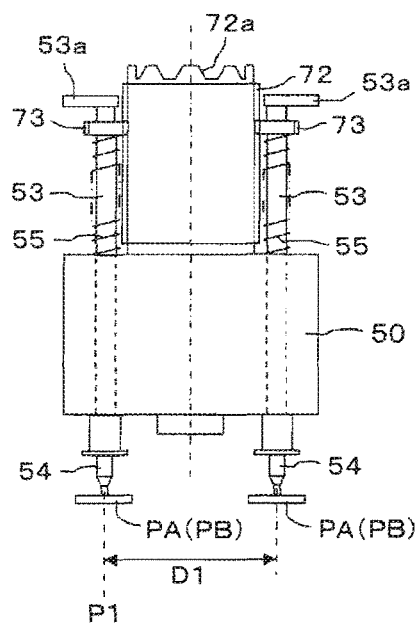
FIG. 2 is a view illustrating a rotary head which holds a plurality of suction nozzles.

As illustrated in FIG. 2, in the rotary head 50, a plurality of nozzle holders 53 is held to be capable of being raised and lowered in a axis direction (vertical direction) at a predetermined angle interval on a circumference, and suction nozzles 54 which suction components PA and PB are held in a downward direction below the nozzle holders 53. Each nozzle holder 53 is biased in an upward direction by the biasing force of a spring 55, and is held at a normal raised end position.

Figure 3:
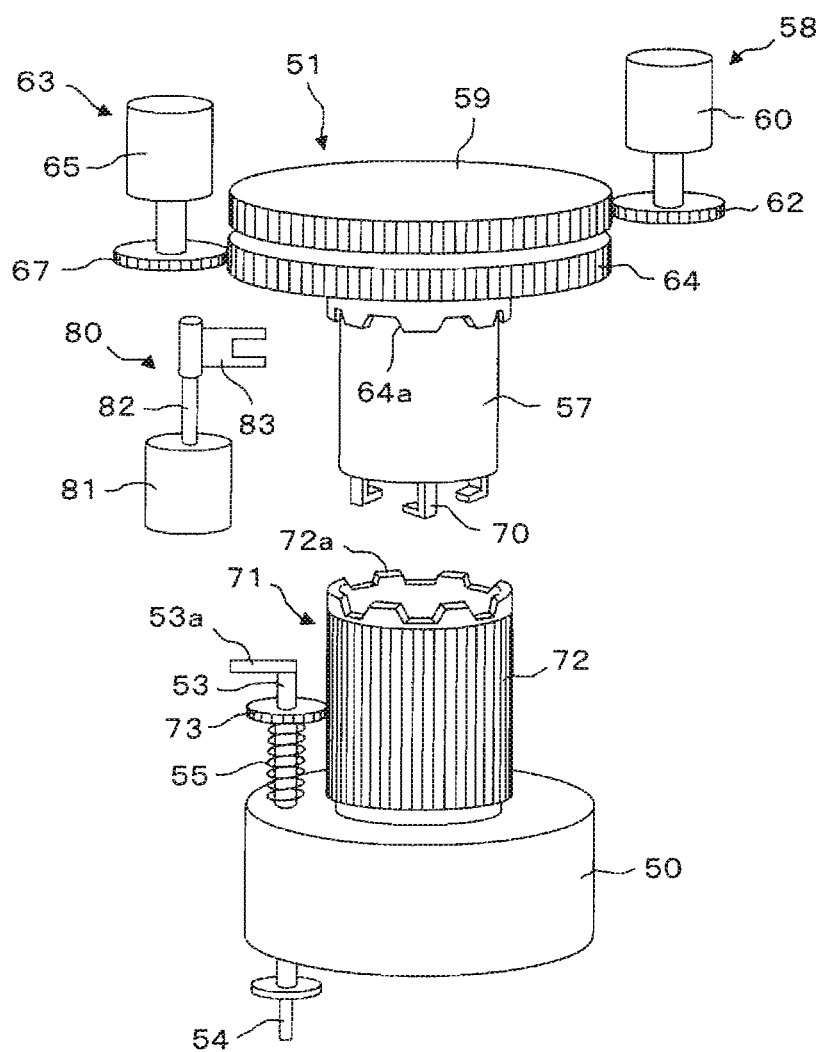
FIG. 3 is a perspective view illustrating a state where the rotary head is detached from a drive unit of the component mounting machine.
Figure 4:
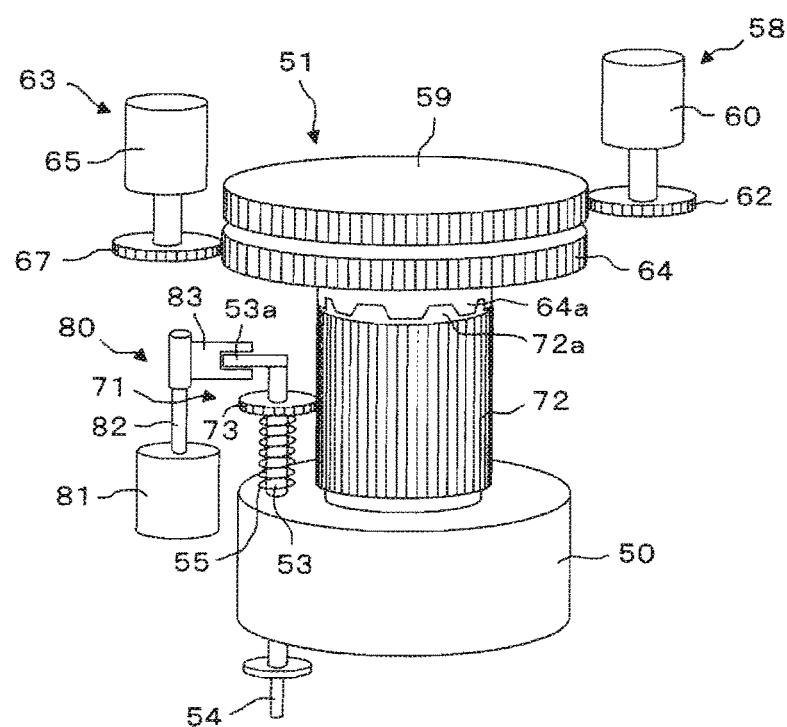
FIG. 4 is a perspective view illustrating a state where the rotary head is combined with the drive unit of the component mounting machine.

As illustrated in FIGS. 3 and 4, the rotary head 50 can be detachably mounted to an R-axis 57 which extends to the lower side of the drive unit 51. At an upper end of the R-axis 57, an R-axis gear 59 of an R-axis drive device 58 is fixed to be concentric to the R-axis 57, and the R-axis gear 59 meshes with a driving gear which is fixed to a rotation axis of an R-axis motor 60.

Accordingly, when the R-axis motor 60 is rotated, the R-axis 57 is rotated via the driving gear 62 and the R-axis gear 59, and the rotary head 50 attached to the R-axis 57 is rotated around the axial line. Due to the rotation of the rotary head 50, the plurality of suction nozzles 54 are also integrally rotated in a circumferential direction of the rotary head 50, and each suction nozzle 54 is sequentially stopped at a plurality of stop positions. One of the plurality of stop positions is considered as a component mounting position P1 (refer to FIG. 2) at which the components PA and PB are mounted on the circuit board B, and the component mounting position P1 is also used as a receiving position at which the components PA and PB are received by the tape feeder 21.

In the R-axis 57, a θ-axis driving gear 64 of a θ-axis driving device 63 is supported to be concentrically rotatable, and the θ-axis driving gear 64 meshes with a driving gear 67 which is fixed to a rotation axis of a θ-axis motor 65. Accordingly, when the θ-axis motor 65 is rotated, the θ-axis driving gear 64 is rotated around the axial line. On a lower surface of the θ-axis driving gear 64, an uneven annular projection 64a is formed in a shape of a ring, and the annular projection 64a is engaged with an uneven annular projection 72a formed on an upper surface of a cylindrical gear 72 which will be described later.

The R-axis 57 of the drive unit 51 functions as a head holding portion which holds the rotary head 50 to be attachable and detachable. In a lower end portion of the R-axis 57, a plurality of L-shaped holding claws 70 for holding the rotary head 50 to be attachable and detachable is provided to be movable in the vertical direction, and the holding claws 70 are configured to vertically move by an air cylinder which is not illustrated. The plurality of holding claws 70 are disposed at an equivalent angle interval in the circumferential direction of the R-axis 57.

Meanwhile, a rotation transmission device 71 which transmits the rotation of the θ-axis driving gear 64 to the plurality of nozzle holders 53 is provided in the rotary head 50. The rotation transmission device 71 is configured of the cylindrical gear 72 which is held to be rotatable around the axial line of the rotary head 50 above the rotary head 50, and nozzle gears 73 which are respectively attached to each nozzle holder 53 and mesh with the cylindrical gear 72.

In addition, when the θ-axis driving gear 64 is rotated with respect to the R-axis 57 due to the θ-axis motor 65 of the drive unit 51, the rotation of the θ-axis driving gear 64 is transmitted to the cylindrical gear 72 via the annular projections 64a and 72a, and each nozzle gear 73 is rotated. Accordingly, following the rotation around the axial line of the cylindrical gear 72, each nozzle holder 53 and each suction nozzle 54 are simultaneously rotated around the θ-axis, and the angular positions of each component suctioned to each suction nozzle 54 can be changed.

Figure 5:
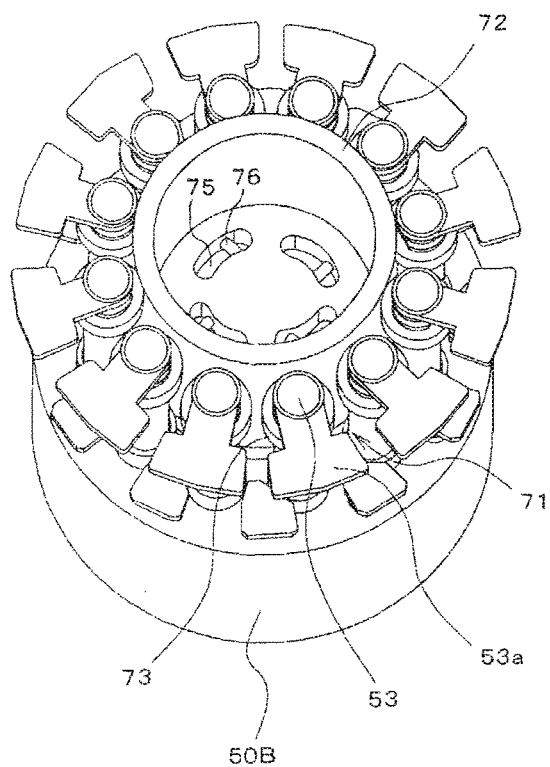
FIG. 5 is a perspective view when the rotary head is viewed from above.

As illustrated in FIG. 5, the cylindrical gear 72 is formed in a shape of a ring to be capable of inserting the R-axis 57 therein. Above the rotary head 50 inside the cylindrical gear 72, a plurality of long holes 75 for inserting each holding claw 70 of the R-axis 57 are formed at an equivalent angle interval on the circumference, and an engagement pin 76 which is engaged with the holding claw 70 is fixed to one end of each of the long holes 75 in the radial direction of the rotary head 50.

Accordingly, the R-axis 57 is inserted into the cylindrical gear 72, the annular projection 64a of the θ-axis driving gear 64 is engaged with the annular projection 72a of the cylindrical gear 72, and the θ-axis driving gear 64 and the cylindrical gear 72 are integrally linked to each other in the rotational direction. At the same time, each holding claw 70 on the R-axis 57 side is inserted into each long hole 75 on the rotary head 50 side, and in this state, the R-axis 57 is rotated and each holding claw 70 is engaged with the engagement pin 76 inside the long hole 75, and then, each holding claw 70 is drawn up. Accordingly, the rotary head 50 is combined with the R-axis 57 of the drive unit 51 (refer to FIG. 4). In addition, in FIG. 5, the annular projection 72a formed on the upper surface of the cylindrical gear 72 is not illustrated.

In addition, as illustrated in FIGS. 3 and 4, in the drive unit 51, a Z-axis drive device 80 which raises and lowers the nozzle holder 53 allocated at the component mounting position P1 is provided. The Z-axis drive device 80 uses a Z-axis motor 81 as a driving source, rotates a feeding screw 82 by the Z-axis motor 81, and raises and lowers a Z-axis slide 83, and according to this, the nozzle holder 53 which is engaged with an engagement portion 53a provided at the upper end of the nozzle holder 53 is raised and lowered.

In the embodiment, the rotary head 50 is configured of at least two types of rotary heads, such as a first rotary head 50A which holds four suction nozzles 54 (nozzle holders 53) on the circumference, and a second rotary head 50B which holds twelve suction nozzles 54 on the circumference. The two types of rotary heads 50A and 50B have the same configuration as each other except for the number of suction nozzles 54, and the pitch circle diameters (P.C.D) of the suction nozzles 54 have the same dimension (D1). In this manner, by this configuration, each drive device is commonly used in the plural types of rotary heads 50, and each rotary head 50 can be easily replaced.

The first rotary head 50A is appropriate for sectioning the components PA which are larger than the predetermined size, the second rotary head 50B is appropriate for suctioning the components PB which are smaller than the predetermined size, and the rotary heads are appropriately replaced corresponding to the type (the size or the shape) of the components to be suctioned by the suction nozzles 54. In addition, one standard of the upper limit of the size of the components PA which can be suctioned by four suction nozzles 54 of the first rotary head 50A is that the components PA suctioned to the four suction nozzles 54 are disposed at an interval which is sufficient so as not to interfere with each other when the four suction nozzles 54 are simultaneously rotated around the θ-axis by the θ-axis motor 65.

As illustrated in FIG. 1, on the base 11, a component camera 85 which is configured of a CCD camera that images the components PA and PB suctioned by the suction nozzles 54 from below is installed. The component camera 85 has a viewing field (image processing area) IA (refer to FIG. 10B) which can image all of the components PB which are smaller than the predetermined size and are suctioned by the twelve suction nozzles 54 held by the second rotary head 50B simultaneously.

Figure 6:
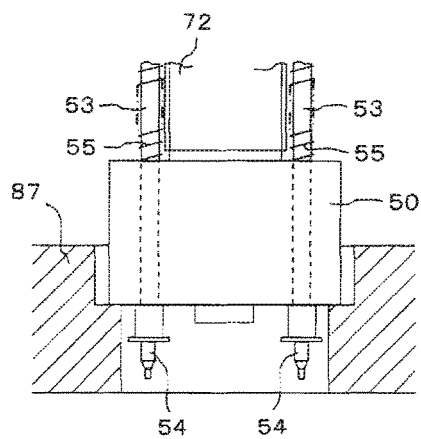
FIG. 6 is a view illustrating a head placing table which has the rotary head placed thereon.

In addition, as illustrated in FIG. 6, on the base 11, a head placing table 87 on which the rotary head 50 detached from the drive unit 51 is placed is provided, and a plurality of head placing tables 87 are provided to be capable of placing the plural types of rotary heads 50A and 50B. In addition, in order to identify the type of the rotary head 50 attached to the drive unit 51, on the upper surface of the rotary head 50, an identification code which is imaged by the board camera 52 may be provided. Otherwise, when the rotary head 50 is replaced with respect to the drive unit 51, the type of the rotary bead 50 may be designated by an operator. In addition, by making the number of nozzles different as either eight or ten, the rotary head 50 having the same configuration may be placed on the head placing table 87.

Figure 7:
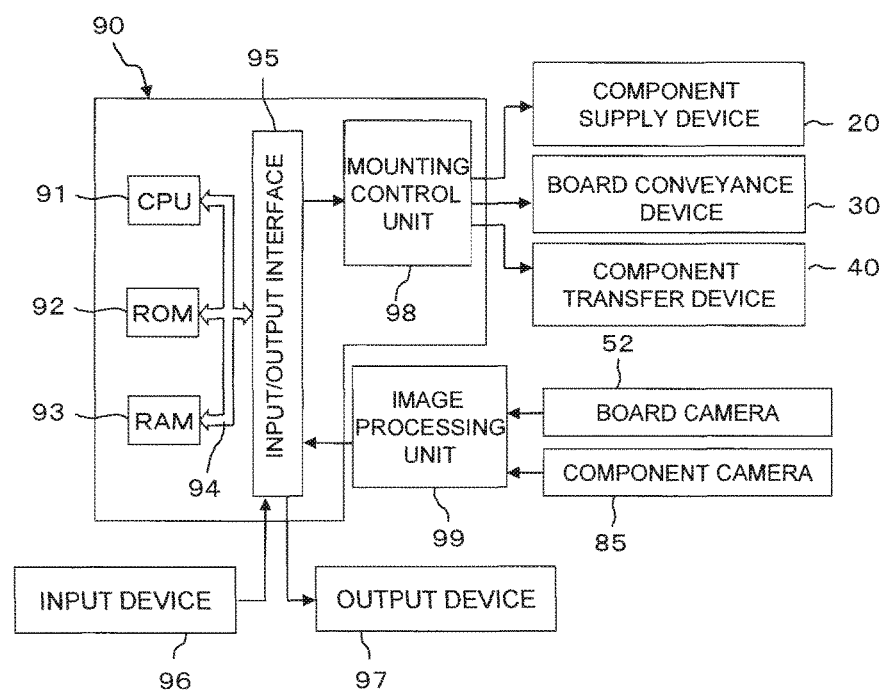
FIG. 7 is a block diagram illustrating a control device which controls the component mounting machine.

FIG. 7 illustrates a control device 90 which controls the component mounting machine 10, and the control device 90 includes a storage device configured of a CPU 91, a ROM 92, a RAM 93, and a bus 94 which connects the CPU 91, the ROM 92, and the RAM 93. An input/output interface 95 is connected to the bus 94, and an input device 96 provided with a keyboard and a mouse, and an output device 97 provided with a displayer or the like, are connected to the input/output interface 95.

A mounting control unit 8 which controls the component supply device 20, the board conveyance device 30, and the component transfer device 40, and an image processing unit 99 or the like which image-processes image data imaged by the board camera 52 and the component camera 85, are connected to the input/output interface 95. In addition, in the storage device (92, 93) of the control device 90, a mounting program for mounting the components PA and PB on the circuit board B is housed, but at least two types of the mounting programs are prepared corresponding to the type of the rotary head 50 attached to the drive unit 51. In addition, in the storage device (93), a position shifting amount and an angle shifting amount which are identified by each of the cameras 52 and 85, or component data, are housed.

Next, a sequence of replacing (attaching and detaching) the rotary head 50 with respect to the drive unit 51 will be described. In addition, hereinafter, an example of replacing the rotary head with the first rotary head 50A which holds four suction nozzles 54, in a state where the second rotary head 50B which holds twelve suction nozzles 54 is attached to the drive unit 51, based on a replacement instruction from the control device 90, will be described.

First, based on the replacement instruction from the control device 90, the movable base 44 is moved, and the second rotary head 50B suctioned to the drive unit 51 is positioned at an upper position of the empty head placing table 87. Then, the drive unit 51 is lowered, and the second rotary head 50B is placed on the empty head placing table 87. In this state, a combination of the second rotary head 50B with respect to the drive unit 51 is released, and the drive unit 51 is raised leaving the second rotary head 50B.

Then, the movable base 44 is moved, and the R-axis 57 of the drive unit 51 is positioned at the upper position of the head placing table 87 on which the first rotary head 50A is placed. In this state, the drive unit 51 is lowered, the R-axis 57 is inserted to the cylindrical gear 72 of the first rotary head 50A, the annular projection 64a of the θ-axis driving gear 64 is engaged with the annular projection 72a of the cylindrical gear 72, and each holding claw 70 or the R-axis 57 side is inserted to each long hole 75 on the rotary head 50A side. In this state, the R-axis 57 is rotated by the R-axis motor 60, and each holding claw 70 is engaged with the engagement pin 76 in the long hole 75. Then, as each holding claw 70 is moved in an upward direction by an air cylinder which is not illustrated, the first rotary head 50A is integrally supplied to the R-axis 57 of the drive unit 51.

Figure 8:
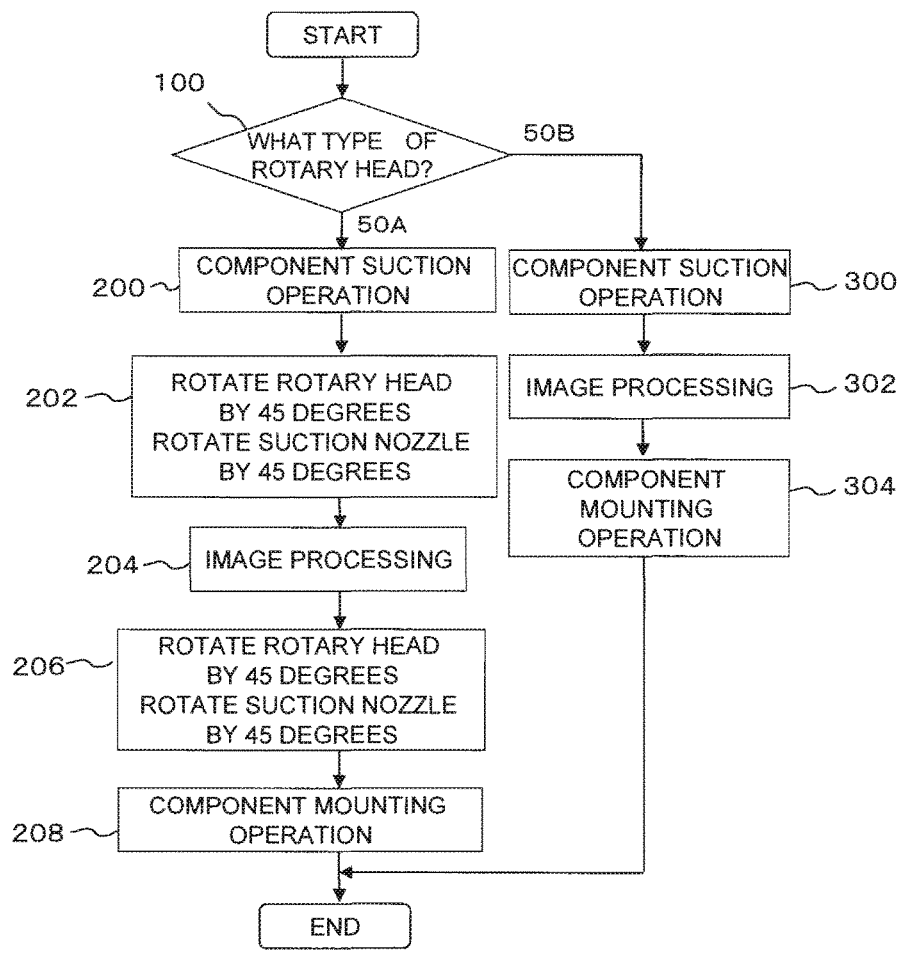
FIG. 8 is a view illustrating a flowchart for controlling the mounting program.

Next, after the components PA and PB are sequentially suctioned to the plurality of suction nozzles 54 held by the rotary heads 50A and 50B, and the components PA and PB are image-processed, the mounting program which is performed by the control device 90 and sequentially mounts the components onto the circuit board B will be described based on a flowchart of FIG. 8.

First, in step 100, it is distinguished whether the rotary head attached to the drive unit 51 is the first rotary head 50A provided with four suction nozzles 54, or the second rotary head 50B provided with twelve suction nozzles 54. In order to distinguish the rotary head, on the upper surfaces of the rotary heads 50A and 50B, the identification code imaged by the board camera 52 may be provided, or the type of rotary heads may be input to the control device 90 by the operator.

In step 100, when it is distinguished that the rotary head is the first rotary head 50A, the mounting program for the first rotary head 50A is read out by the ROM 92 of the control device 90, each step after step 200 is performed. Meanwhile, when it is distinguished that the rotary head is the second rotary head 50B, the mounting program for the second rotary head SOB is read out by the ROM 92 of the control device 90, and each step after step 300 is performed.

At first, a step of distinguishing that the rotary head is the second rotary head 50B (having twelve suction nozzles 54) will be described. First, in step 300, a component suction operation which sequentially suctions the components to the twelve suction nozzles is performed. In other words, the second rotary head SOB attached to the drive unit 51 is moved in the X-axis and Y-axis directions together with the movable base 44, and the nozzle holders 53 (suction nozzles 54) at a top allocated at the component mounting position P1 are positioned at the component supply position 21a of the tape feeder 21 which accommodates the components PB. Next, the nozzle holders 53 allocated at the component mounting position P1 are lowered by the Z-axis slide 83, and the components PB are suctioned by the suction nozzles 54. After this, the Z-axis slide 83 is raised.

Next, the second rotary head 50B is rotated by a unit angle (30 degrees) in the direction of normal rotation, and the next suction nozzle 54 is allocated at the component mounting position P1. In addition, as the unit angle rotation of the rotary head 50A and the raising and lowering of the nozzle holders 53 by the Z-axis slide 83 are mutually repeated, the components PB are suctioned to each suction nozzle 54.

In this manner, when the components PB are suctioned the final suction nozzle 54, and the components PB are suctioned to all of the suction nozzles 54, the second rotary head 50B is further rotated by a unit angle degrees) in the direction of normal rotation, and the nozzle holders 53 at the top are allocated at the component mounting position P1.

Next, in step 302, the image-processing of the components PB suctioned to all of the suction nozzles 54 is performed. In other words, the movable base 44 is moved in the X-axis and Y-axis directions, and the center of rotation of the rotary head 50B is positioned at a position that matches an optical axis of the component camera 85. In addition, all of the components PB suctioned to the suction nozzles 54 are imaged from below by the component camera 85 simultaneously, and the imaged image data is image-processed by the image processing unit 99 of the control device 90. Accordingly, the positional shift and the angular shift of each component PB with respect to the centers of the suction nozzles 54 are obtained, and the positional shift and the angular shift data are stored in the RAM 93 of the control device 90.

Then, in step 304, a mounting operation of the components PB suctioned to the suction nozzles 54 onto the circuit board B is performed. In other words, the movable base 44 is moved in the X-axis and Y-axis directions, and the suction nozzle 54 at the to of the rotary head 50A is positioned at a predetermined position on the circuit board B. At this time, based on the data of the positional shift obtained by the above-described image-processing, the movement amount of the movable base 44 is corrected, and based on the data of angular shift, the suction nozzle 54 is rotated around the θ-axis by the θ-axis motor 65 and the angular shift is corrected. Accordingly, regardless of the discrepancy between the suctioned positions of the components PB by the suction nozzles 54, it is possible to accurately position the components PB at the predetermined position on the circuit board B.

Then, the nozzle holder 53 at the op allocated at the component mounting position P1 is lowered by the Z-axis slide 83, and the components PB suctioned by the suction nozzles 54 are mounted at the predetermined position on the circuit board B. After this, the Z-axis slide 83 is raised. At this time, since the movement amount of the movable base 44 and the angular position of the suction nozzle 54 are corrected based on the positional shift and the angular shift, regardless of the discrepancy between the suctioned positions of the components by the suction nozzle 54, it is possible to accurately mount the components on the circuit board B.

Hereinafter, as the unit angle rotation of the rotary head 50B, and the raising and lowering of the nozzle holder 53 by the Z-axis slide are mutually repeated, all of the components PB suctioned to the twelve suction nozzles 54 are respectively mounted at the predetermined position of the circuit board B.

In addition, the above-described sequence from step 300 to step 304 is the same as that in the related art.

Next, a sequence of distinguishing that the rotary head is the first rotary head 50A (having four suction nozzles 54) will be described. First, in step 200, the component suction operation which sequentially suctions the components PA to the four suction nozzles 54 is performed. In other words, as described in the second rotary head 50B, the first rotary head 50A mounted on the drive unit 51 is moved in the X-axis and Y-axis directions together with the movable base 44, and the nozzle holders 53 (suction nozzles 54) at the top allocated at the component mounting position P1 are positioned at the component supply position 21a of the tape feeder 21 which accommodates the components PA. Next, the nozzle holders 53 allocated at the component mounting position P1 are lowered by the Z-axis slide 83, and the components PA are suctioned by the suction nozzles 54. After this, the Z-axis slide 83 is raised.

Next, the first rotary head 50A is rotated by a unit angle (90 degrees) in the direction of normal rotation (clockwise in FIG. 9), and the next suction nozzle 54 is allocated at the component mounting position P1. In addition, as the unit angle rotation of the rotary head 50A and the raising and lowering of the nozzle holders 53 by the Z-axis slide 83 are mutually repeated, the components PA are respectively suctioned to each suction nozzle 54.

Figure 9:
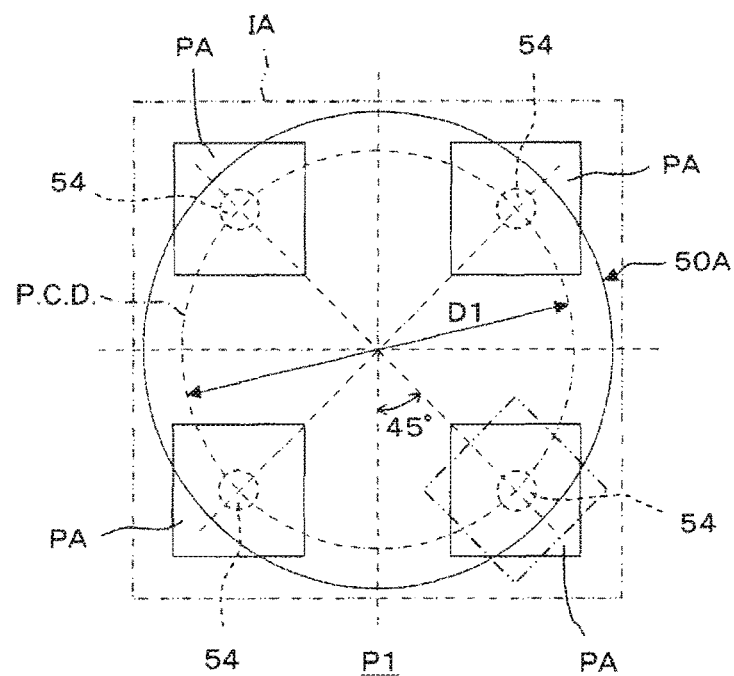
FIG. 9 is a view illustrating a state where components suctioned to four suction heads held by a first rotary head are imaged.

In this manner, when the components PA are suctioned to the final suction nozzle 54, and the components are suctioned to all of the suction nozzles 54, then, in step 202, the rotary head 50A is rotated by 45 degrees (½ of the unit angle) in the direction of normal rotation, and the nozzle holders 53 at the top are allocated at the angular position which is different from the component mounting position P1 by 45 degrees (refer to two-dot chain lines in FIG. 9). At the same time, the θ-axis driving gear 64 is rotated only by a predetermined angle by the θ-axis motor 65, and each suction nozzle 54 is respectively rotated by 45 degrees around the θ-axis together with each nozzle gear 73 via the cylindrical gear 72 (a state of solid lines in FIG. 9).

Next, in step 204, the image-processing of the components PA suctioned to all of the suction nozzles 54 is performed. In other words, the movable base 44 is moved in the X-axis and Y-axis directions, and the center of rotation of the rotary head 50A positioned at a position that matches the optical axis of the component camera 85. In addition, all of the components PA suctioned to the suction nozzles 54 are imaged from below by the component camera 85 simultaneously, and the positional shift and the angular shift of each component PA with respect to the centers of the suction nozzles 54 are obtained by the image-processing similar to that description above.

Figure 10A:
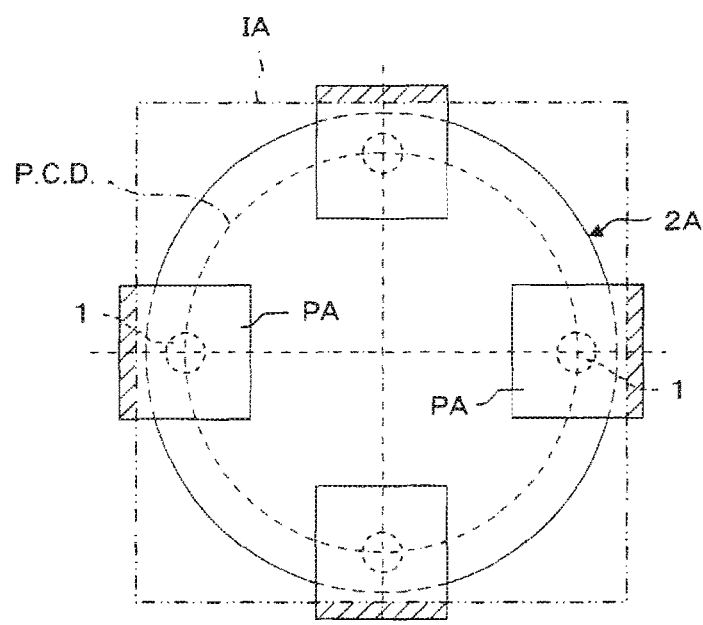
FIG. 10A is a view illustrating related art, and a view illustrating a state where large components suctioned to four suction nozzles are imaged.
Figure 10B:
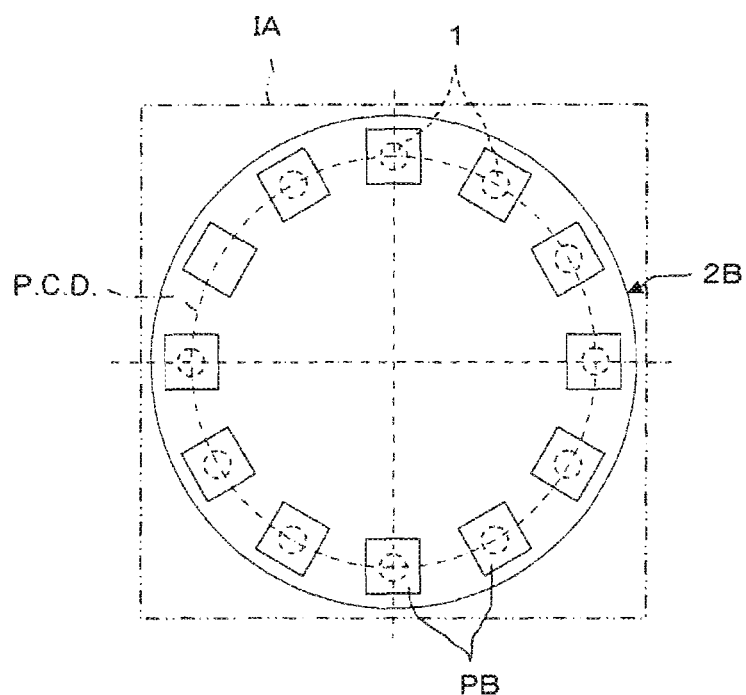
FIG. 10B is a view illustrating related art, and a view illustrating a state where small components suctioned to twelve suction nozzles are imaged.

At this time, as described above, as the rotary head 50A rotates by 45 degrees and the suction nozzle 54 rotates by 45 degrees, as illustrated in FIG. 9, each side of each component PA suctioned to the suction nozzle 54 is controlled to be changed to have an angle at which the sides of the components are parallel to the sides of the rectangular viewing field IA of the component camera 85. Accordingly, the components PA suctioned to the suction nozzle 54 are larger than the predetermined size, and in the image-processing in the related art, as illustrated in FIG. 10A, even in a case of large components PA that protrude from the viewing field IA of the component camera, all of the components PA suctioned to the suction nozzle 54 can be in the determined viewing field IA, and it is not necessary to enlarge the viewing field of the camera.

When the image-processing is completed, in step 206, the rotary head 50A is further rotated by 45 degrees in the direction of normal rotation, the suction nozzle 54 is rotated by 45 degrees, and the nozzle holder 53 at the top is positioned at the component mounting position P1.

Then, in step 208, the mounting operation of the components PA suctioned to the suction nozzle 54 onto the circuit board B is performed. In other words, as described by the second rotary head 50B, the movable base 44 is moved in the X-axis and Y-axis directions, and the suction nozzle 54 at the top of the first rotary head 50A are positioned at the predetermined position on the circuit board B. At this time, the correction processing is performed based on the positional shift and the angular shift obtained by the above-described image-processing, as described above.

Next, the nozzle holder 53 at the top allocated at the component mounting position P1 is lowered by the Z-axis slide 83, and the components PA suctioned to the suction nozzle 54 are mounted at the predetermined position on the circuit board B. After this, the Z-axis slide 83 is raised.

Hereinafter, as the unit angle rotation of the rotary head 50A, and the raising and lowering the nozzle holder 53 by the Z-axis slide 83 are mutually repeated, the components PA suctioned to all of the suction nozzles 54 are respectively mounted at the predetermined position of the circuit board B.

When the rotary heads 50A and 50B which are different types from each other are attached to the drive unit 51 by the above-described step 100, a switching control section which switches the mounting program that mounts the components PA and PB onto the circuit board B is configured.

According to the above-described embodiment, when the first rotary head 50A which holds four suction nozzles 54 is attached to the drive unit 51, the rotary head 50A is rotated so that the suction nozzle 54 is at the angular position which is different from the component mounting position P1 by 45 degrees, each suction nozzle 54 is rotated by 45 degrees, and each component PA suctioned to the suction nozzle 54 is controlled to be changed to have an angle at which sides of each component are parallel to each side of the viewing field IA of the component camera 85. Therefore, all of the components PA suctioned to each suction nozzle 54 can be in the determined viewing field IA, and it is possible to image all of the components PA suctioned to each suction nozzle 54 within one viewing field simultaneously without increasing the viewing field of the component camera 85.

In addition, according to the above embodiment, in the control device 90, at least two types of mounting programs which control the rotation angle of the rotary head 50 and the rotation angle of the components suctioned to the suction nozzles 54 are stored corresponding to the type of the rotary head 50 when mounting the components. When a different type of rotary head 50 is attached to the drive unit 51, since the switching control section (step 100) which switches the mounting program is provided, the sequence operation which corresponds to the type of the rotary head 50 can be accurately performed by switching the mounting program by the switching control section.

In addition, according to the above-described embodiment, since the R-axis drive device 58 which rotates the rotary head 50 around the axial line of the center thereof, the θ-axis driving device 63 which rotates the suction nozzle 54 around the θ-axis, and the Z-axis drive device 80 which raises and lowers the suction nozzle 54 in the Z-axis direction are provided in the drive unit 51, and by only providing the drive device on the common drive unit 51 side to which the plural types of rotary heads 50A and 50B are attached and detached, it is possible to achieve the small size and light weight of the rotary heads 50A and 50B, and the switching operation of the rotary heads 50A and 50B also becomes easy.

Furthermore, according to the above-described embodiment, the cylindrical gear 72 which is rotated by the θ-axis driving device 63 is supported to be rotatable around the axial line of the rotary head 50, and each suction nozzle 54 is rotated around the θ-axis as the cylindrical gear 72 rotates around the axial line of the rotary head 50. Therefore, it is possible to commonly use the driving device 63 which rotates each suction nozzle 54 around the θ-axis in each suction nozzle 54.

In the above-described embodiment, an example in which the rotary head 50A having four suction nozzles 54 and the rotary head 50B having twelve suction nozzles 54 can be attached and detached is described, but the present disclosure can be employed in a component mounting machine in which a rotary head having at least four suction nozzles 54 and a rotary head in which the number of suction nozzles 54 is more than four (for example, eight or ten) can be replaced being attached and detached.

In addition, in the above-described embodiment, an example in which the movable base 44 is moved in the X-axis direction and in the Y-axis direction by the XY robot is described, but the present disclosure is not limited to the example in which the movable base 44 is moved by the XY robot. For example, the movable base 44 may be moved within the XY plane surface by an articulated robot, such as a SCARA robot.

Furthermore, in the above-described embodiment, an example in which the drive unit 51 is supported to be capable of being vertically moved on the movable base 44 in order to attach and detach the rotary head 50 to and from the drive unit 51, is described. However, instead of the vertical movement of the drive unit 51, the head placing table 87 side on which the rotary head 50 is placed can be vertically moved.

In addition, the configuration described above in which the rotary head 50 (50A, 50B) is combined with the drive unit 51 to be attachable and detachable is merely an appropriate example of the embodiment of the present disclosure, and the disclosure is not limited to the configuration described in the embodiment.

In this manner, the present disclosure can employ various aspects without departing from the main idea of the present disclosure described in the scope of the claims.

INDUSTRIAL APPLICABILITY

A component mounting machine according to the present disclosure is appropriate to be employed in a component mounting machine in which a rotary head provided with a plurality of suction nozzles on a circumference can be replaced.

REFERENCE SIGNS LIST

10 . . . COMPONENT MOUNTING MACHINE, 11 . . . BASE, 44 . . . MOVABLE BASE, 50, 50A, 50B . . . ROTARY HEAD, 51 . . . DRIVE UNIT, 53 . . . NOZZLE HOLDER, 54 . . . SUCTION NOZZLE, 58 . . . R-AXIS DRIVE DEVICE, 63 . . . θ-AXIS DRIVING DEVICE, 80 . . . Z-AXIS DRIVE DEVICE, 85 . . . COMPONENT CAMERA, 90 . . . CONTROL DEVICE, 92, 93 . . . STORAGE DEVICE, PA, PB . . . COMPONENT, B . . . CIRCUIT BOARD, STEP 100 . . . SWITCHING CONTROL SECTION

The invention claimed is:

1. A component mounting machine, comprising:
   a movable base which is movable within an XY plane with respect to a base;
   a rotary head which is attached to be attachable to and detachable from a drive unit supported by the movable base, which holds a plurality of suction nozzles on a circumference, and which is rotatable around an axial line;
   a component camera which can image all of the components suctioned to the plurality of suction nozzles of the rotary head at once within one viewing field; and
   a control device in which an angular position of the first rotary head and an angular position of the component suctioned to the suction nozzle are respectively controlled to be changed by 45 degrees when the first rotary head is attached to the drive unit, and the component held by the suction nozzle is imaged by the component camera, wherein
   the rotary head includes a first rotary head in which four suction nozzles are respectively held to be rotatable on the circumference, and a second rotary head in which the suction nozzles of which the number is more than four are respectively held to be rotatable, and
   a pitch circle diameter of the suction nozzles of the first rotary head is the same as a pitch circle dimeter of the suction nozzles of the second rotary head.

2. The component mounting machine according to claim 1,
   wherein, the first rotary head is attached to the drive unit when components which are larger than a predetermined size are suctioned to the suction nozzle, the second rotary head is attached to the drive unit when components which are smaller than the predetermined size are suctioned to the suction nozzle, and the component camera has a viewing field having a size necessary for imaging all of the components suctioned to the suction nozzles of the second rotary head.

3. The component mounting machine according to claim 1,
   wherein, in the control device, at least two types of mounting programs which control a rotation angle of the rotary head and a rotation angle of the component suctioned to the suction nozzle, corresponding to the type of the rotary head, are stored, and a switching control section, which switches the mounting program when a different type of the rotary head is attached to the drive unit is provided.

4. The component mounting machine according to claim 1,
   wherein, in the drive unit, an R-axis drive device which rotates the rotary head around the axial line, a θ-axis drive device which rotates the suction nozzle around a θ-axis, and a Z-axis drive device which raises and lowers the suction nozzle in a Z-axis direction, are provided.

5. The component mounting machine according to claim 4,
   wherein a cylindrical gear rotated by the θ-axis drive device is supported to be rotatable around the axial line of the rotary head, and as the cylindrical gear rotates around the axial line, each suction nozzle rotates around the θ-axis.

* * * * *